United States Patent
Wu et al.

(10) Patent No.: US 11,749,331 B2
(45) Date of Patent: Sep. 5, 2023

(54) REFRESH MODES FOR PERFORMING VARIOUS REFRESH OPERATION TYPES

(71) Applicant: MICRON TECHNOLOGY, INC., Boise, ID (US)

(72) Inventors: Jun Wu, Shanghai (CN); Yu Zhang, Shanghai (CN); Dong Pan, Boise, ID (US)

(*) Notice: Subject to any disclaimer, the term of this patent is extended or adjusted under 35 U.S.C. 154(b) by 0 days.

(21) Appl. No.: 17/662,733

(22) Filed: May 10, 2022

(65) Prior Publication Data

US 2022/0270670 A1 Aug. 25, 2022

Related U.S. Application Data

(63) Continuation of application No. 16/997,659, filed on Aug. 19, 2020, now Pat. No. 11,348,631.

(51) Int. Cl.
*G11C 11/401* (2006.01)
*G11C 11/406* (2006.01)
(Continued)

(52) U.S. Cl.
CPC ....... *G11C 11/40611* (2013.01); *G11C 11/402* (2013.01); *G11C 11/4085* (2013.01);
(Continued)

(58) Field of Classification Search
CPC ............ H01L 27/108; H01L 27/10805; G11C 11/40611; G11C 11/402; G11C 11/40603;
(Continued)

(56) References Cited

U.S. PATENT DOCUMENTS

| | | |
|---|---|---|
| 5,299,159 A | 3/1994 | Balistreri et al. |
| 5,654,929 A | 8/1997 | Mote, Jr. |

(Continued)

FOREIGN PATENT DOCUMENTS

| | | |
|---|---|---|
| CN | 1841551 A | 10/2006 |
| CN | 101026003 A | 8/2007 |

(Continued)

OTHER PUBLICATIONS

U.S. Appl. No. 18/064,773, filed Dec. 12, 2022, titled, "Apparatuses and Methods for Access Based Refresh Timing," pp. all pages of application as filed.

(Continued)

*Primary Examiner* — Mushfique Siddique

(57) ABSTRACT

Apparatuses, systems, and methods for refresh modes. A memory may need to perform targeted refresh operations to refresh the 'victim' word lines which are near to frequently accessed 'aggressor' word lines. To refresh the victims at a high enough rate, it may be desirable to refresh multiple victims as part of the same refresh operation. However, certain word lines (e.g., word lines in a same section or adjacent sections of the memory) cannot be refreshed together. The memory may have a section comparator, which may check stored aggressor addresses and may provide a signal if there are not two stored addresses which can be refreshed together. Based, in part, on the signal, the memory may activate one of several different refresh modes, which may control the types of refresh operation performed responsive to a refresh signal.

17 Claims, 9 Drawing Sheets

(51) Int. Cl.
*G11C 11/4096* (2006.01)
*G11C 11/4091* (2006.01)
*G11C 11/408* (2006.01)
*G11C 11/402* (2006.01)

(52) U.S. Cl.
CPC ...... *G11C 11/4091* (2013.01); *G11C 11/4096* (2013.01); *G11C 11/40603* (2013.01); *G11C 11/40618* (2013.01)

(58) Field of Classification Search
CPC ............ G11C 11/4091; G11C 11/4085; G11C 11/40618; G11C 11/4096
See application file for complete search history.

(56) References Cited

U.S. PATENT DOCUMENTS

| | | | |
|---|---|---|---|
| 5,699,297 | A | 12/1997 | Yamazaki et al. |
| 5,867,442 | A | 2/1999 | Kim et al. |
| 5,933,377 | A | 8/1999 | Hidaka |
| 5,943,283 | A | 8/1999 | Wong et al. |
| 5,956,288 | A | 9/1999 | Bermingham et al. |
| 5,959,923 | A | 9/1999 | Matteson et al. |
| 5,970,507 | A | 10/1999 | Kato et al. |
| 5,999,471 | A | 12/1999 | Choi |
| 6,002,629 | A | 12/1999 | Kim et al. |
| 6,011,734 | A | 1/2000 | Pappert |
| 6,061,290 | A | 5/2000 | Shirley |
| 6,064,621 | A | 5/2000 | Tanizaki et al. |
| 6,212,118 | B1 | 4/2001 | Fujita |
| 6,306,721 | B1 | 10/2001 | Teo et al. |
| 6,310,806 | B1 | 10/2001 | Higashi et al. |
| 6,310,814 | B1 | 10/2001 | Hampel et al. |
| 6,363,024 | B1 | 3/2002 | Fibranz |
| 6,392,952 | B1 | 5/2002 | Chen et al. |
| 6,424,582 | B1 | 7/2002 | Ooishi |
| 6,434,064 | B2 | 8/2002 | Nagai |
| 6,452,868 | B1 | 9/2002 | Fister |
| 6,515,928 | B2 | 2/2003 | Sato et al. |
| 6,535,950 | B1 | 3/2003 | Funyu et al. |
| 6,535,980 | B1 | 3/2003 | Kumar et al. |
| 6,567,340 | B1 | 5/2003 | Nataraj et al. |
| 6,950,364 | B2 | 9/2005 | Kim |
| 7,002,868 | B2 | 2/2006 | Takahashi |
| 7,057,960 | B1 | 6/2006 | Fiscus et al. |
| 7,082,070 | B2 | 7/2006 | Hong |
| 7,187,607 | B2 | 3/2007 | Koshikawa et al. |
| 7,203,113 | B2 | 4/2007 | Takahashi et al. |
| 7,203,115 | B2 | 4/2007 | Eto et al. |
| 7,209,402 | B2 | 4/2007 | Shinozaki et al. |
| 7,215,588 | B2 | 5/2007 | Lee |
| 7,444,577 | B2 | 10/2008 | Best et al. |
| 7,551,502 | B2 | 6/2009 | Dono et al. |
| 7,565,479 | B2 | 7/2009 | Best et al. |
| 7,692,993 | B2 | 4/2010 | Iida et al. |
| 7,830,742 | B2 | 11/2010 | Han |
| 8,174,921 | B2 | 5/2012 | Kim et al. |
| 8,400,805 | B2 | 3/2013 | Yoko |
| 8,526,260 | B2 | 9/2013 | Pyeon |
| 8,572,423 | B1 | 10/2013 | Isachar et al. |
| 8,625,360 | B2 | 1/2014 | Iwamoto et al. |
| 8,681,578 | B2 | 3/2014 | Narui |
| 8,756,368 | B2 | 6/2014 | Best et al. |
| 8,811,100 | B2 | 8/2014 | Ku |
| 8,862,973 | B2 | 10/2014 | Zimmerman et al. |
| 8,938,573 | B2 | 1/2015 | Greenfield et al. |
| 9,032,141 | B2 | 5/2015 | Bains et al. |
| 9,047,978 | B2 | 6/2015 | Bell et al. |
| 9,076,499 | B2 | 7/2015 | Schoenborn et al. |
| 9,087,602 | B2 | 7/2015 | Youn et al. |
| 9,117,544 | B2 | 8/2015 | Bains et al. |
| 9,123,447 | B2 | 9/2015 | Lee et al. |
| 9,153,294 | B2 | 10/2015 | Kang |
| 9,190,137 | B2 | 11/2015 | Kim et al. |
| 9,190,139 | B2 | 11/2015 | Jung et al. |
| 9,236,110 | B2 | 1/2016 | Bains et al. |
| 9,251,885 | B2 | 2/2016 | Greenfield et al. |
| 9,286,964 | B2 | 3/2016 | Halbert et al. |
| 9,299,400 | B2 | 3/2016 | Bains et al. |
| 9,311,984 | B1 | 4/2016 | Hong et al. |
| 9,311,985 | B2 | 4/2016 | Lee et al. |
| 9,324,398 | B2 | 4/2016 | Jones et al. |
| 9,384,821 | B2 | 7/2016 | Bains et al. |
| 9,390,782 | B2 | 7/2016 | Best et al. |
| 9,396,786 | B2 | 7/2016 | Yoon et al. |
| 9,406,358 | B1 | 8/2016 | Lee |
| 9,412,432 | B2 | 8/2016 | Narui et al. |
| 9,418,723 | B2 | 8/2016 | Chishti et al. |
| 9,424,907 | B2 | 8/2016 | Fujishiro |
| 9,484,079 | B2 | 11/2016 | Lee |
| 9,514,850 | B2 | 12/2016 | Kim |
| 9,570,143 | B2 | 2/2017 | Lim et al. |
| 9,570,201 | B2 | 2/2017 | Morgan et al. |
| 9,646,672 | B1 | 5/2017 | Kim et al. |
| 9,653,139 | B1 | 5/2017 | Park |
| 9,672,889 | B2 | 6/2017 | Lee et al. |
| 9,685,240 | B1 | 6/2017 | Park |
| 9,691,466 | B1 | 6/2017 | Kim |
| 9,697,913 | B1 | 7/2017 | Mariani et al. |
| 9,734,887 | B1 | 8/2017 | Tawa |
| 9,741,409 | B2 | 8/2017 | Jones et al. |
| 9,741,447 | B2 | 8/2017 | Akamatsu |
| 9,747,971 | B2 | 8/2017 | Bains et al. |
| 9,761,297 | B1 | 9/2017 | Tomishima |
| 9,786,351 | B2 | 10/2017 | Lee et al. |
| 9,799,391 | B1 | 10/2017 | Wei |
| 9,805,782 | B1 | 10/2017 | Liou |
| 9,805,783 | B2 | 10/2017 | Ito et al. |
| 9,812,185 | B2 | 11/2017 | Fisch et al. |
| 9,818,469 | B1 | 11/2017 | Kim et al. |
| 9,831,003 | B2 | 11/2017 | Sohn et al. |
| 9,865,326 | B2 | 1/2018 | Bains et al. |
| 9,865,328 | B1 | 1/2018 | Desimone et al. |
| 9,922,694 | B2 | 3/2018 | Akamatsu |
| 9,934,143 | B2 | 4/2018 | Bains et al. |
| 9,953,696 | B2 | 4/2018 | Kim |
| 9,978,430 | B2 | 5/2018 | Seo et al. |
| 10,020,045 | B2 | 7/2018 | Riho |
| 10,020,046 | B1 | 7/2018 | Uemura |
| 10,032,501 | B2 | 7/2018 | Ito et al. |
| 10,049,716 | B2 | 8/2018 | Proebsting |
| 10,083,737 | B2 | 9/2018 | Bains et al. |
| 10,090,038 | B2 | 10/2018 | Shin |
| 10,134,461 | B2 | 11/2018 | Bell et al. |
| 10,141,042 | B1 | 11/2018 | Richter |
| 10,147,472 | B2 | 12/2018 | Jones et al. |
| 10,153,031 | B2 | 12/2018 | Akamatsu |
| 10,170,174 | B1 | 1/2019 | Ito et al. |
| 10,192,608 | B2 | 1/2019 | Morgan |
| 10,210,925 | B2 | 2/2019 | Bains et al. |
| 10,297,305 | B1 | 5/2019 | Moon et al. |
| 10,297,307 | B1 | 5/2019 | Raad et al. |
| 10,339,994 | B2 | 7/2019 | Ito et al. |
| 10,381,327 | B2 | 8/2019 | Ramachandra et al. |
| 10,446,256 | B2 | 10/2019 | Ong et al. |
| 10,468,076 | B1 | 11/2019 | He et al. |
| 10,490,250 | B2 | 11/2019 | Ito et al. |
| 10,490,251 | B2 | 11/2019 | Wolff |
| 10,504,577 | B1 | 12/2019 | Alzheimer |
| 10,510,396 | B1 | 12/2019 | Notani et al. |
| 10,572,377 | B1 | 2/2020 | Zhang et al. |
| 10,573,370 | B2 | 2/2020 | Ito et al. |
| 10,607,679 | B2 | 3/2020 | Nakaoka |
| 10,685,696 | B2 | 6/2020 | Brown et al. |
| 10,699,796 | B2 | 6/2020 | Benedict et al. |
| 10,790,005 | B1 | 9/2020 | He et al. |
| 10,825,505 | B2 | 11/2020 | Rehmeyer |
| 10,832,792 | B1 | 11/2020 | Penney et al. |
| 10,930,335 | B2 | 2/2021 | Bell et al. |
| 10,943,636 | B1 | 3/2021 | Wu et al. |
| 10,950,289 | B2 | 3/2021 | Ito et al. |
| 10,957,377 | B2 | 3/2021 | Noguchi |
| 10,964,378 | B2 | 3/2021 | Ayyapureddi et al. |
| 10,978,132 | B2 | 4/2021 | Rehmeyer et al. |

(56) References Cited

U.S. PATENT DOCUMENTS

| | | |
|---|---|---|
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,320,377 B2 | 5/2022 | Chen et al. |
| 11,348,631 B2 | 5/2022 | Wu et al. |
| 11,380,382 B2 | 7/2022 | Zhang et al. |
| 11,417,383 B2 | 8/2022 | Jenkinson et al. |
| 11,532,346 B2 | 12/2022 | Brown et al. |
| 11,557,331 B2 | 1/2023 | Mitsubori et al. |
| 11,610,622 B2 | 3/2023 | Rehmeyer et al. |
| 11,615,831 B2 | 3/2023 | Yamamoto |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0106838 A1 | 5/2007 | Choi |
| 2007/0147154 A1 | 6/2007 | Lee |
| 2007/0165042 A1 | 7/2007 | Yagi |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028137 A1 | 1/2008 | Schakel et al. |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1* | 11/2013 | Jung ............... G11C 11/40622 711/106 |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |

(56) References Cited

U.S. PATENT DOCUMENTS

| | | |
|---|---|---|
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0117030 A1* | 4/2017 | Fisch .................. G11C 11/4078 |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |

(56) References Cited

U.S. PATENT DOCUMENTS

| | | |
|---|---|---|
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194050 A1 | 6/2020 | Akamatsu |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1* | 10/2020 | Meier ............... G11C 11/40622 |
| 2020/0381040 A1* | 12/2020 | Penney ................. G11C 11/408 |
| 2020/0388324 A1* | 12/2020 | Rehmeyer ........... H01L 25/0657 |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1* | 4/2021 | Li ........................... G11C 29/20 |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0406170 A1 | 12/2021 | Jung et al. |
| 2022/0059153 A1 | 2/2022 | Zhang et al. |
| 2022/0059158 A1 | 2/2022 | Wu et al. |
| 2022/0093165 A1 | 3/2022 | Mitsubori et al. |
| 2022/0165328 A1 | 5/2022 | Ishikawa et al. |
| 2022/0189539 A1 | 6/2022 | Li et al. |
| 2022/0199144 A1 | 6/2022 | Roberts |
| 2022/0270670 A1 | 8/2022 | Wu et al. |

FOREIGN PATENT DOCUMENTS

| | | |
|---|---|---|
| CN | 101038785 A | 9/2007 |
| CN | 101067972 A | 11/2007 |
| CN | 104350546 A | 2/2015 |
| CN | 104733035 A | 6/2015 |
| CN | 104981874 A | 10/2015 |
| CN | 105529047 A | 4/2016 |
| CN | 106710621 A | 5/2017 |
| CN | 107025927 A | 8/2017 |
| CN | 107871516 A | 4/2018 |
| CN | 108154895 A | 6/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| TW | 201801079 A | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

International Application No. PCT/US20/23689, titled "Semiconductor Device Having Cam That Stores Address Signals", dated Mar. 19, 2020, pp. all pages of application as filed.

U.S. Appl. No. 16/797,658, titles "Apparatuses and Methods for Controlling Refresh Operations", filed Feb. 21, 2020, pp. all pages of application as filed.

U.S. Appl. No. 16/818,981 titled "Apparatuses and Methods for Staggered Timing of Targeted Refresh Operations" filed Mar. 13, 2020, pp. all pages of application as filed.

U.S. Appl. No. 16/824,460, titled "Semiconductor Device Performing Row Hammer Refresh Operation", dated Mar. 19, 2020, pp. all pages of application as filed.

U.S. Appl. No. 16/025,844, titled "Apparatus and Methods for Triggering Row Hammer Address Sampling", filed Jul. 2, 2018, pp. all pages of application as filed.

U.S. Appl. No. 16/783,063, titled "Apparatus and Methods for Triggering Row Hammer Address Sampling", dated Feb. 5, 2020, pp. all pages of application as filed.

U.S. Appl. No. 16/805,197, titled "Apparatuses and Methods for Calculating Row Hammer Refresh Addresses in a Semiconductor Device", dated Feb. 28, 2020, pp. all pages of application as filed.

U.S. Appl. No. 16/232,837, titled "Apparatuses and Methods for Distributed Targeted Refresh Operations", filed Dec. 26, 2018, pp. all pages of application as filed.

U.S. Appl. No. 16/818,989, titled "Semiconductor Device Performing Row Hammer Refresh Operation", dated Mar. 13, 2020, pp. all pages of application as filed.

U.S. Appl. No. 16/268,818, titled "Apparatuses and Methods for Managing Row Access Counts", filed Feb. 6, 2019, pp. all pages of application as filed.

U.S. Appl. No. 16/286,187 titled "Apparatuses and Methods for Memory Mat Refresh Sequencing" filed Feb. 26, 2019, pp. all pages of application as filed.

U.S. Appl. No. 16/084,119, titled "Apparatuses and Methods for Pure-Time, Self Adopt Sampling for Row Hammer Refresh Sampling", filed Sep. 11, 2018, pp. all pages of application as filed.

U.S. Appl. No. 16/886,284 titled "Apparatuses and Methods for Access Based Refresh Timing" filed May 28, 2020, pp. all pages of application as filed.

U.S. Appl. No. 16/886,284, titled "Apparatuses and Methods for Access Based Refresh Timing", dated May 28, 2020, pp. all pages of application as filed.

U.S. Appl. No. 16/358,587, titled "Semiconductor Device Having Cam That Stores Address Signals", dated Mar. 19, 2019, pp. all pages of application as filed.

U.S. Appl. No. 16/375,716 titled "Apparatuses and Methods for Staggered Timing of Targeted Refresh Operations" filed Apr. 4, 2019, pp. all pages of application as filed.

U.S. Appl. No. 16/411,573 titled "Apparatuses, Systems, and Methods for a Content Addressable Memory Cell" filed May 14, 2019, pp. all pages of application as filed.

U.S. Appl. No. 16/428,625 titled "Apparatuses and Methods for Tracking Victim Rows" filed May 31, 2019, pp. all pages of application as filed.

U.S. Appl. No. 16/432,604 titled "Apparatuses and Methods for Staggered Timing of Skipped Refresh Operations" filed Jun. 5, 2019, pp. all pages of application as filed.

U.S. Appl. No. 17/008,396 titled "Apparatuses and Methods for Staggered Timing of Targeted Refresh Operations" filed Aug. 31, 2020, pp. all pages of application as filed.

U.S. Appl. No. 16/513,400 titled "Apparatuses and Methods for Tracking Row Accesses" filed Jul. 16, 2019, pp. all pages of application as filed.

(56) References Cited

OTHER PUBLICATIONS

U.S. Appl. No. 16/548,027 titled "Apparatuses, Systems, and Methods for Analog Row Access Rate Determination" filed Aug. 22, 2019, pp. all pages of application as filed.
U.S. Appl. No. 16/549,942 titled "Apparatuses and Methods for Lossy Row Access Counting" filed Aug. 23, 2019, pp. all pages of application as filed.
U.S. Appl. No. 16/546,152 titled "Apparatuses and Methods for Analog Row Access Tracking" filed Aug. 20, 2019, pp. all pages of application as filed.
U.S. Appl. No. 16/549,411 titled "Apparatuses and Methods for Dynamic Refresh Allocation" filed Aug. 23, 2019, pp. all pages of application as filed.
U.S. Appl. No. 16/655,110 titled "Apparatuses and Methods for Dynamic Targeted Refresh Steals" filed Oct. 16, 2019, pp. all pages of application as filed.
U.S. Appl. No. 17/186,913 titled "Apparatuses and Methods for Dynamic Refresh Allocation" filed Feb. 26, 2021, pp. all pages of application as filed.
U.S. Appl. No. 17/187,002 titled "Apparatuses and Methods for Staggered Timing of Targeted Refresh Operations" filed Feb. 26, 2021, pp. all pages of application as filed.
U.S. Appl. No. 17/347,957 titled "Apparatuses and Methods for Controlling Steal Rates" filed Jun. 15, 2021, pp. all pages of application as filed.
International Application No. PCT/US19/40169 titled "Apparatus and Methods for Triggering Row Hammer Address Sampling" filed Jul. 1, 2019, pp. all pages of application as filed.
International Application No. PCT/US19/64028, titled "Semiconductor Device Performing Row Hammer Refresh Operation", dated Dec. 2, 2019, pp. all pages of application as filed.
International Application No. PCT/US20/26689, titled "Apparatuses and Methods for Staggered Timing of Targeted Refresh Operations", dated Apr. 3, 2020, pp. all pages of application as filed.
International Application No. PCT/US20/32931, titled "Apparatuses and Methods for Controlling Steal Rates", dated May 14, 2020, pp. all pages of application as filed.
U.S. Appl. No. 16/788,657, titled "Semiconductor Device Performing Row Hammer Refresh Operation", dated Feb. 12, 2020, pp. all pages of application as filed.
U.S. Appl. No. 15/324,621 titled "Apparatuses and Methods for Pure-Time, Self-Adopt Sampling for Row Hammer Refresh Sampling" filed May 19, 2021, pp. all pages of application as filed.
U.S. Appl. No. 15/881,256 entitled 'Apparatuses and Methods for Detecting a Row Hammer Attack With a Bandpass Filter' filed Jan. 26, 2018, pp. all pages of application as filed.
U.S. Appl. No. 16/425,525 titled "Apparatuses and Methods for Tracking All Row Accesses" filed May 29, 2019, pp. all pages of application as filed.
U.S. Appl. No. 16/427,105 titled "Apparatuses and Methods for Priority Targeted Refresh Operations" filed May 30, 2019, pp. all pages of application as filed.
U.S. Appl. No. 16/427,140 titled "Apparatuses and Methods for Tracking Row Access Counts Between Multiple Register Stacks" filed May 30, 2019, pp. all pages of application as filed.
U.S. Appl. No. 16/437,811 titled "Apparatuses, Systems, and Methods for Determining Extremum Numerical Values" filed Jun. 11, 2019, pp. all pages of application as filed.
U.S. Appl. No. 16/537,981 titled "Apparatuses and Methods for Controlling Targeted Refresh Rates" filed Aug. 12, 2019, pp. all pages of application as filed.
U.S. Appl. No. 16/994,338 titled "Apparatuses, Systems, and Methods for Memory Directed Access Pause" filed Aug. 14, 2020, pp. all pages of application as filed.
U.S. Appl. No. 16/997,766 titled "Refresh Logic Circuit Layouts Thereof" filed Aug. 19, 2020, pp. all pages of application as filed.
U.S. Appl. No. 16/997,659 titled "Apparatuses, Systems, and Methods for Refresh Modes" filed Aug. 19, 2020, pp. all pages of application as filed.

U.S. Appl. No. 17/095,978 titled "Apparatuses and Methods for Controlling Refresh Timing" filed Nov. 12, 2020, pp. all pages of application as filed.
U.S. Appl. No. 17/127,654 titled "Apparatuses and Methods for Row Hammer Based Cache Lockdown" filed Dec. 18, 2020, pp. all pages of application as filed.
U.S. Appl. No. 17/175,485 titled "Apparatuses and Methods for Distributed Targeted Refresh Operations" filed Feb. 12, 2021, pp. all pages of application as filed.
U.S. Appl. No. 15/789,897, entitled "Apparatus and Methods for Refreshing Memory", filed Oct. 20, 2017, pp. all pages of application as filed.
U.S. Appl. No. 15/796,340, entitled: "Apparatus and Methods for Refreshing Memory" filed Oct. 27, 2017, pp. all pages of application as filed.
U.S. Appl. No. 16/012,679, titled "Apparatuses and Methods for Multiple Row Hammer Refresh Address Sequences", filed Jun. 19, 2018, pp. all pages of application as filed.
U.S. Appl. No. 16/020,863, titled "Semiconductor Device", filed Jun. 27, 2018, pp. all pages of application as filed.
U.S. Appl. No. 16/112,471 titled "Apparatuses and Methods for Controlling Refresh Operations" filed Aug. 24, 2018, pp. all pages of application as filed.
U.S. Appl. No. 16/160,801, titled "Apparatuses and Methods for Selective Row Refreshes" filed Oct. 15, 2018, pp. all pages of application as filed.
U.S. Appl. No. 16/176,932, titled "Apparatuses and Methods for Access Based Refresh Timing", filed Oct. 31, 2018, pp. all pages of application as filed.
U.S. Appl. No. 16/208,217, titled "Semiconductor Device Performing Row Hammer Refresh Operation", filed Dec. 3, 2018, pp. all pages of application as filed.
U.S. Appl. No. 16/230,300, titled "Apparatuses and Methods for Staggered Timing of Targeted Refresh Operations" filed Dec. 21, 2018, pp. all pages of application as filed.
U.S. Appl. No. 16/231,327 titled "Apparatuses and Methods for Selective Row Refreshes", filed Dec. 21, 2018, pp. all pages of application as filed.
U.S. Appl. No. 16/237,291, titled "Apparatus and Methods for Refreshing Memory", filed Dec. 31, 2018, pp. all pages of application as filed.
U.S. Appl. No. 16/290,730, titled "Semiconductor Device Performing Row Hammer Refresh Operation", filed Mar. 1, 2019, pp. all pages of application as filed.
U.S. Appl. No. 16/374,623, titled "Semiconductor Device Performing Row Hammer Refresh Operation", filed Apr. 3, 2019, pp. all pages of application as filed.
U.S. Appl. No. 16/411,698 title "Semiconductor Device" filed May 14, 2019, pp. all pages of application as filed.
U.S. Appl. No. 16/427,330 titled "Apparatuses and Methods for Storing Victim Row Data" filed May 30, 2019, pp. all pages of application as filed.
U.S. Appl. No. 16/431,641 titled "Apparatuses and Methods for Controlling Steal Rates" filed Jun. 4, 2019, pp. all pages of application as filed.
U.S. Appl. No. 16/682,606, titled "Apparatuses and Methods for Distributing Row Hammer Refresh Events Across a Memory Device", filed Nov. 13 2019, pp. all pages of application as filed.
U.S. Appl. No. 17/654,035, titled "Apparatuses and Methods for Dynamic Targeted Refresh Steals", filed Mar. 8, 2022; pp. all pages of application as filed.
U.S. Appl. No. 15/876,566 entitled 'Apparatuses and Methods for Calculating Row Hammer Refresh Addresses in a Semiconductor Device' filed on Jan. 22, 2018, pp. all pages of application as filed.
U.S. Appl. No. 17/226,975, titled "Apparatuses and Methods for Targeted Refreshing of Memory", filed Jul. 21, 2017, pp. all pages of application as filed.
U.S. Appl. No. 17/226,975, titled "Apparatuses and Methods for Staggered Timing of Skipped Refresh Operations" filed Apr. 9, 2021, pp. all pages of application as filed.
U.S. Appl. No. 16/459,520 titled "Apparatuses and Methods for Monitoring Word Line Accesses", filed Jul. 1, 2019, pp. all pages of application as filed.

(56) References Cited

OTHER PUBLICATIONS

International Application No. PCT/US18/55821 "Apparatus and Methods for Refreshing Memory" filed Oct. 15, 2018, pp. all pages of application as filed.
U.S. Appl. No. 15/715,846, entitled "Semiconductor Device", filed Sep. 26, 2017, pp. all pages of application as filed.
U.S. Appl. No. 15/888,993, entitled "Apparatuses and Methods for Controlling Refresh Operations", filed Feb. 5, 2018, pp. all pages of application as filed.
U.S. Appl. No. 16/190,627 titled "Apparatuses and Methods for Targeted Refreshing of Memory" filed Nov. 14, 2018, pp. all pages of application as filed.
U.S. Appl. No. 17/030,018, titled "Apparatuses and Methods for Controlling Refresh Operations", filed Sep. 23, 2020, pp. all pages of application as filed.
U.S. Appl. No. 15/281,818, entitled: "Semiconductor Device" filed Sep. 30, 2016, pp. all pages of application as filed.
Kim, et al., "Flipping Bits in MemoryWithout Accessing Them: An Experimental Study of DRAM Disturbance Errors", IEEE, Jun. 2014, 12 pgs.
U.S. Appl. No. 17/731,529, titled "Apparatuses and Methods for Access Based Refresh Dperations"; filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.
Kyungbae Park et al. "Experiments and Root Cause Analysis for Active-Precharge Hammering Fault in DDR3 SDRAM Under 3 X NM Technology";; Microelectronics Reliability: An Internet. Journal and World Abstracting Service; vol. 57, Dec. 23, 2015; pp. 39-46.

\* cited by examiner

REFRESH MODES FOR PERFORMING VARIOUS REFRESH OPERATION TYPES

CROSS REFERENCE TO RELATED APPLICATION(S)

This application is a continuation of U.S. patent application Ser. No. 16/997,659 filed Aug. 19, 2020 and issued as U.S. Pat. No. 11,348,631 on May 31, 2022. The aforementioned application, and issued patent, is incorporated herein by reference, in its entirety, for any purpose.

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. The information in the memory cells may decay over time. To prevent the loss of information, the memory may periodically refresh the information in the memory cells.

DETAILED DESCRIPTION

Figure 1:
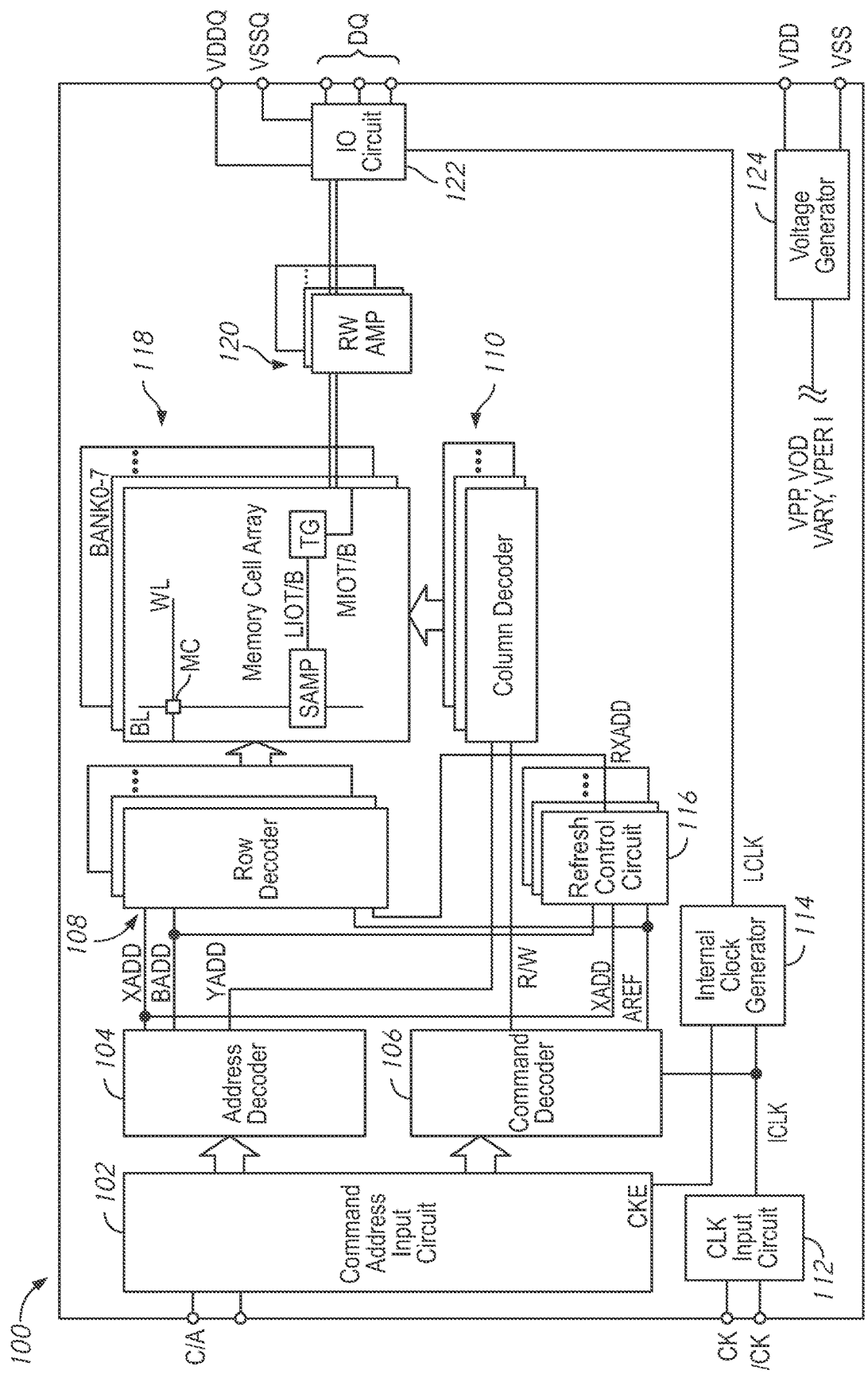
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). Information may be stored in the memory cells (e.g., as a charge on a capacitive element). The information may decay over time. The memory may refresh the memory cells to restore the value of the information stored therein. For example, the memory may enter a self-refresh mode where the memory is refreshed on a row-by-row basis. For example, a first group of rows may be refreshed, then a next group of rows, etc. Refreshing one or more rows from such a sequence may be referred to as an auto-refresh operation. The rate at which the rows are refreshed may be based on a rate of information decay, and the memory may work its way through the sequence of auto-refresh operations such that information is not lost.

Certain conditions may increase the rate at which information decays in the memory. For example, if a particular row is accessed repeatedly, the memory cells in nearby rows may decay at an increased rate. Accordingly, it may be important to identify the repeatedly accessed 'aggressor' rows so that their nearby 'victim' rows can be refreshed as part of a targeted refresh. During a self-refresh mode, the memory may perform a mix of auto-refresh and targeted refresh operations, to ensure that victim rows are refreshed in a timely manner, since the information therein might otherwise decay before they were refreshed as part of an auto-refresh operation. However, this may lead to trade-offs, since the targeted refresh operations may consume timeslots which would have otherwise been used for auto-refresh operations.

To save on time, the memory may refresh multiple rows at the same time. However, certain addresses cannot be refreshed as part of the same refresh operation. While the addresses used as part of the auto-refresh operations may be predictable and may be chosen such that multiple addresses can be simultaneously refreshed, the addresses involved in targeted refreshes are not generally predictable, and may include addresses which cannot be refreshed together. For example, the memory may identify victim rows which cannot be simultaneously refreshed (e.g., because they are in a same section of the memory). It may be important to dynamically reallocate the types of refreshes the memory performs to account for different conditions of the memory.

The present disclosure is directed to apparatuses, systems, and methods for refresh modes. A memory may have different refresh modes. Responsive to a refresh signal, the memory may perform different numbers and types of refresh operations based on the active refresh mode. For example, a first mode may include targeted refresh operations where more than one victim address is refreshed at once, while a second mode may include targeted refresh operations where only one victim address is refreshed at a time. The memory may monitor various indicators of the memory to determine which refresh mode to activate. For example a refresh control circuit may track if identified aggressor rows are in a same section of memory or not. If they are not, then the first refresh mode can be used. If they are, and cannot be refreshed simultaneously, then the second refresh mode may be used.

In some embodiments, the memory may include additional refresh modes, which may help to ensure that both auto and targeted refresh operations are being performed at a high enough rate to prevent information decay. For example, the memory may include a counter which is changed based on the active refresh mode. Based, in part, on the counter additional refresh modes may be activated, where, for example, only auto-refresh operations are performed.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B). Conversely, write data is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the RW amplifiers 120, which then provide the data along a global data bus to the IO circuit 122. The read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the RW amplifiers 120. The write data is written to a memory cells in the memory array 118 corresponding to the bank address, row address, and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116.

Responsive to each pulse of the refresh signal AREF, a number of word lines of the memory array 118 may be refreshed. The refresh control circuit 116 may generate a number of internal 'pumps' associated with each pulse of the refresh signal AREF. Each pump may be accompanied by one or more refresh addresses RXADD, which may indicate which word line(s) should be refreshed as part of that pump. For example, the refresh control circuit 116 may receive the refresh signal AREF and may issue two pumps. The first pump may be associated with a first refresh address RXADD1, and the second pump may be associated with refresh addresses RXADD2 and RXADD3. In some embodiments, each refresh address may be used to indicate more than one word line. Continuing the previous example, the first refresh address RXADD1 may cause 4 word lines to be refreshed, while the second and third refresh addresses RXADD2 and RXADD3 may each cause one word line to be refreshed. The different pumps (and refresh addresses) may be associated with auto-refresh or targeted refresh operations.

The auto-refresh operations may involve refreshing word lines in a sequence (e.g., WL0, WL1, WL2, . . . WLn, WL0). The refresh addresses issued as part of an auto-refresh operation may be referred to as auto-refresh addresses. Targeted refresh operations may involve selecting specific word lines to refresh. For example, the refresh control circuit 116 may track accesses to the memory array 118 in order to identify aggressor rows (and/or potential aggressor rows) and may calculate the address(es) of the victims of those aggressors to be refreshed as part of a targeted refresh operation. For the sake of brevity, the term aggressor address will be used to refer to addresses identified by the memory as aggressors, regardless of whether they are actual or potential aggressors.

The refresh control circuit 116 may perform a mix of auto-refresh operations and targeted refresh operations. The type of refresh operation performed may be based on how the refresh address RXADD is generated. Thus a first pump may be an auto-refresh operation, a second pump may be a targeted refresh operation, etc. The refresh control circuit 116 may decide how many pumps to generate and how to allocate the pumps between different refresh operations. The refresh control circuit 116 may activate one or more different refresh modes, which may govern the number and type of refresh operation performed responsive to an activation of the refresh signal AREF. Different types of refresh mode that may be activated are discussed in more detail herein. The refresh control circuit 116 may include logic (e.g., a state machine) which determines which refresh mode is active. After performing refresh operations responsive to an activation of the refresh signal AREF, the refresh control circuit 116 may use one or more criteria to determine if a same or a different refresh mode should be activated.

While some refresh modes are active, the refresh control circuit 116 may issue two refresh addresses as part of each pump when performing a targeted refresh operation. However, there may be circumstances where this is not possible, because the two refresh addresses are associated with word lines which cannot both be refreshed at the same time. For example, the two addresses may represent word lines in the same (or adjacent sections as each other). The refresh control circuit 116 may store aggressor word lines in an aggressor detector circuit. The refresh control circuit 116 may check to see if there are at least two stored aggressors which can be refreshed at the same time (e.g., because they are in different non-adjacent sections). If so, a first refresh mode may be activated where victims based on those addresses are both refreshed as part of the same refresh pump. If not, a second refresh mode may be activated where victims based on those addresses are refreshed sequentially.

Figure 2:
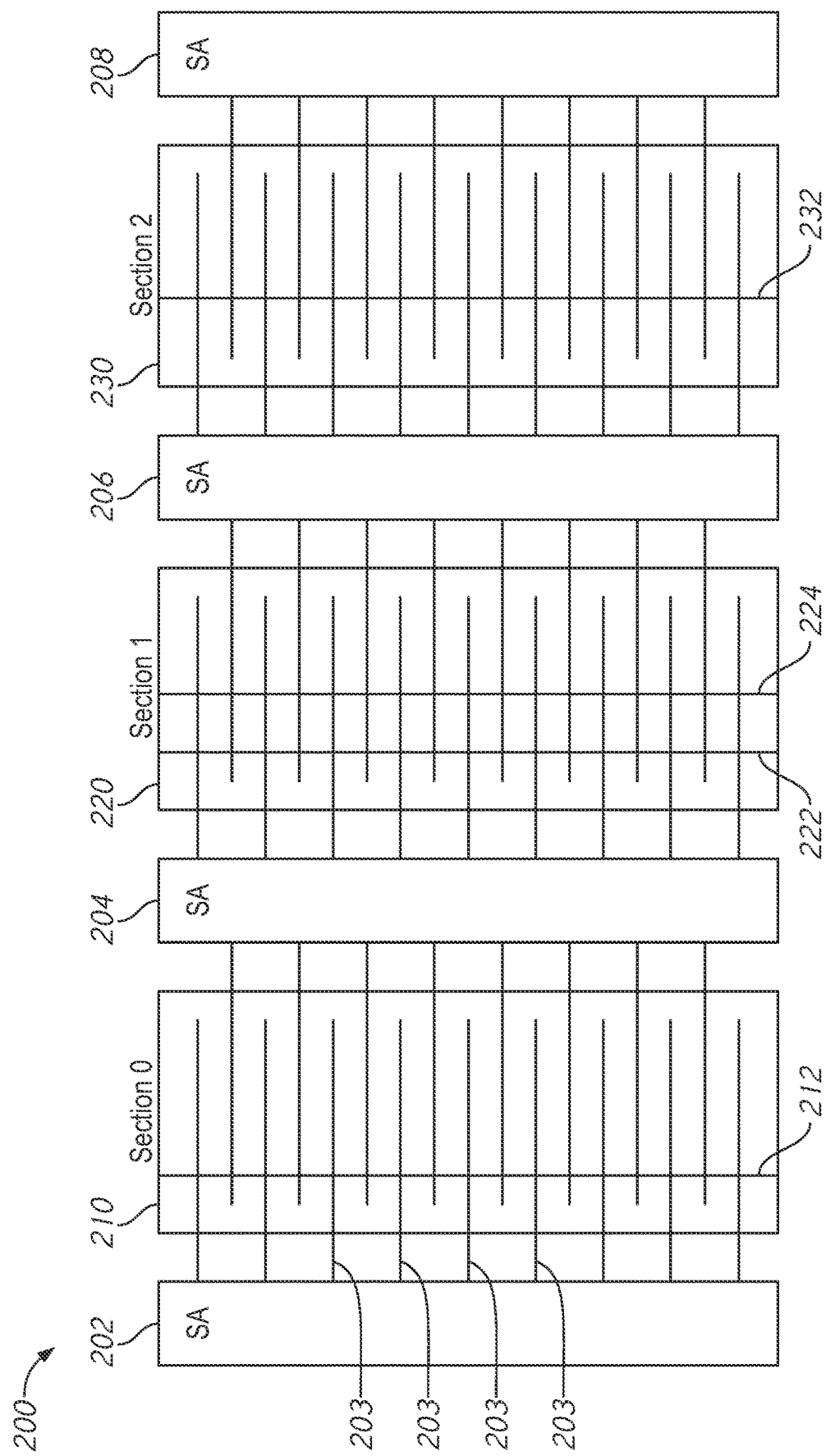
FIG. 2 is a block diagram of a memory array according to some embodiments of the present disclosure.

FIG. 2 is a block diagram of a memory array according to some embodiments of the present disclosure. The memory array 200 may, in some embodiments, be included in the memory array 118 of FIG. 1. The memory array 200 is a simplified view of a memory array to help illustrate the problem of refreshing multiple word lines in the same (or adjacent) sections as part of the same refresh operation.

The memory array 200 includes three sections, section 0 210, section 1 220, and section 2 230. Each section includes a number of memory cells at the intersection of digit lines 203 and word lines such as word lines 212, 222, 224, and 232. For the sake of clarity, only a limited number of sections, digit lines, and word lines are shown. Other example embodiments may have more (or fewer) sections, digit lines, and word lines.

The digit lines may be coupled to a set of sense amplifiers, which may be shared between different adjacent sections. For example, sense amplifiers 204 are shared by both section 0 210 and section 1 220, while sense amplifiers 206 are shared by both section 1 220 and section 2 230. During a refresh operation, a word line indicated by the refresh address RXADD may be activated. The digit lines 203 may read the information from the activated word line out to the sense amplifiers. The sense amplifiers may use the non-activated digit lines 203 in the adjacent section as a reference voltage. The sense amplifiers may determine the value read out along the active digit line based on a comparison of the voltage read out with the reference voltage, and may then restore the initial value of the memory cell back along the digit line to the memory cell at the intersection with the active word line.

It may not be possible to simultaneously refresh two word lines which are in the same section, such as the word lines 222 and 224. The digit lines which intersect the word line 222 may also intersect the word line 224. Accordingly, the sense amplifiers 204 and 206 can't read and write data to both word lines 222 and 224 at the same time.

It may also not be possible to simultaneously refresh two word lines which are in different but adjacent sections, since the shared sense amplifiers can't be used to read data from digit lines in both of the coupled sections at the same time. For example, if the refresh address indicates the word line 222, then information may be read out along digit lines 203 to the sense amplifiers 204 and to the sense amplifiers 206. The sense amplifiers 204 may use the digit lines 203 in the section 210 as a reference, while the sense amplifiers 206 may use the digit lines 203 in the section 230 as a reference. Accordingly, while only a word line 222 in the section 220 is active, the digit lines of the adjacent sections 210 and 230 are in use to provide reference voltages to the sense amplifiers 204 and 206. Thus, while the word line 222 is being refreshed it may not be possible to refresh word lines 212 or 232 at the same time. Note that it would be possible to refresh word lines 212 and 232 at the same time since they are in non-adjacent sections 210 and 230 respectively, and no sense amplifiers are shared.

Referring back to FIG. 1, the refresh control circuit 116 may include a section comparator, which checks to see if the stored addresses which have been identified as aggressors are in the same section or not (since their victims to be refreshed will also be in the same section as the aggressors). The section comparator may also check to see if they are in adjacent sections or not. The value of the row address may be used to check for section similarity/adjacency. For example a portion of the row address (e.g., a subset of the bits of the row address) may indicate which section the word line associated with that row address is in. If there are multiple aggressor addresses stored in the aggressor detector which are associated with word lines in different (non-adjacent) sections, then the refresh control circuit 116 may provide multiple refresh addresses as part of a targeted refresh operation. If all of the aggressors are in the same (or mutually adjacent) sections, then the refresh control circuit 116 may provide one refresh address as part of each targeted refresh operation. For example, the addresses in the aggressor detector may all be associated with word lines in sections adjacent to at least one other address in the aggressor detector, however as long as there is at least a pair that is non-adjacent to each other, the victims of that pair may be refreshed together. For example, if the memory stores addresses for word lines 212, 222, 224, and 232, even though all those addresses are associated with word lines in at least one other adjacent section, word lines 212 and 232 may be refreshed at the same time.

Figure 3:
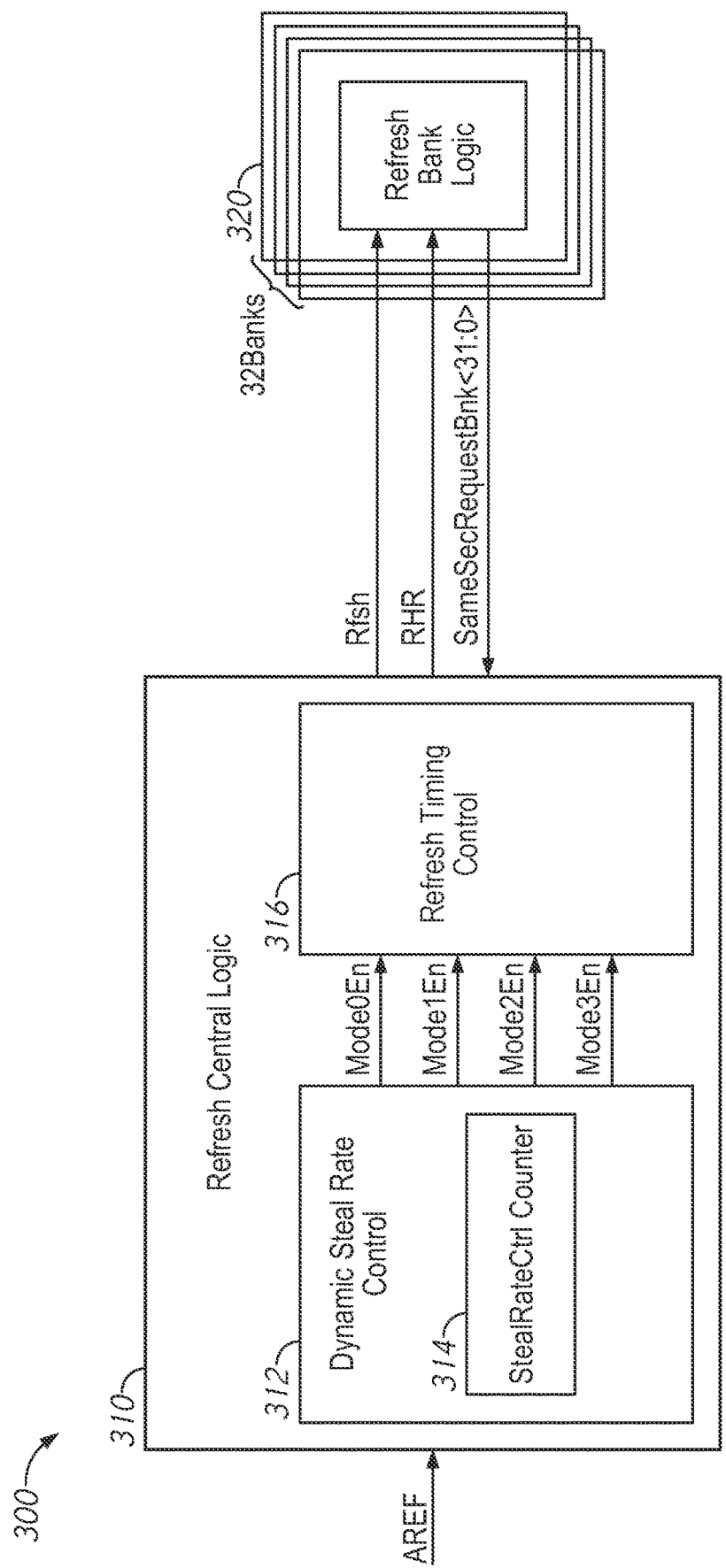
FIG. 3 is a block diagram of a refresh control circuit according to some embodiments of the present disclosure.

FIG. 3 is a block diagram of a refresh control circuit according to some embodiments of the present disclosure. The refresh control circuit 300 may, in some embodiments, be included in the refresh control circuit 116 of FIG. 1.

The refresh control circuit 300 may have a first portion 310 which is shared between the banks, and individual bank logic 320, each of which may be associated with one of the banks of the memory array (e.g., 118 of FIG. 1). In the example of FIG. 3, there may be 32 banks (e.g., Bank0 to Bank31), however more or fewer banks may be used in other example embodiments. The bank logic 320 will be described in more detail in FIG. 4.

The refresh control circuit 300 may receive an activation (e.g., a pulse) of the refresh signal AREF. Based on a currently active refresh mode, the central portion 310 of the refresh control circuit 300 provides a number of pump signals to the bank logic portions 320, which in turn provide refresh addresses to their respective banks' row decoders. For example, the central portion 310 may provide a signal Rfsh which indicates that an auto-refresh operation should be performed and a signal RHR which indicates that a targeted refresh operation should be performed. In some embodiments, the bank portions 320 may receive the signals Rfsh and RHR in common. Accordingly, each of the banks may perform the same number of pumps and the same types of refresh operation in common based on which refresh mode is activated by the central portion 310.

The central portion 310 includes a dynamic steal rate control circuit 312 which determines which refresh mode is currently active. For example, the dynamic steal rate control circuit 312 may act as a state machine, and may enable one of several different refresh modes. In the example of FIG. 3, the refresh control circuit 300 has four different modes (e.g., Mode0 to Mode3). The details of different refresh modes will be discussed in more detail in FIGS. 5-6. Which refresh mode is active may, in part, determine the number and type of the pump signals Rfsh and RHR which are provided to the bank portions 320.

The dynamic steal rate control circuit 312 provides enable signals to indicate which refresh mode the device is currently in. For example, the dynamic steal rate control circuit 312 may have an enable signal for each of the modes Mode0En, Mode1En, Mode2En, and Mode3En. These may be binary signals which are in a high level when that mode is enabled (while the other enable signals may be at a low level). Other schemes may be used in other example embodiments for the enable signals. For example a single multi-bit enable signal may be used, which has different states for different modes (e.g., a two bit signal with four states, one for each mode).

The dynamic steal rate control circuit 312 may use various methods to determine which refresh mode to enable. For example, the dynamic steal rate control circuit 312 may include a steal rate control counter 314. The steal rate control counter 314 may manage a steal rate control count (SRCC) value which is used to track a deficit of auto-refresh operations. For example, if the memory enters a refresh mode where auto-refresh refresh operations are primarily performed, then the steal rate control counter 314 may increase the SRCC value. When the memory enters a refresh mode where targeted refresh operations are primarily performed, the steal rate control counter 314 may decrease the SRCC value. The SRCC value being at a minimum (and/or below a threshold) may trigger the activation of a refresh mode where more auto-refresh operations are performed. More details of the management of the steal rate control counter 314 is discussed in FIG. 5. The steal rate control counter 314 may store the SRCC value as a binary number. The number of bits used to store the SRCC may be based, in part, on the calculations used to determine which refresh modes should be used with what frequency. In some embodiments, the SRCC may be a 4 bit number. Other lengths of the SRCC may be used in other embodiments. The length of the SRCC value may be based, in part, on the desired rates of auto-refresh and targeted refresh operations.

The dynamic steal rate control circuit 312 may also receive a same section signal SameSecRequestBnk from the bank portions 320 of the refresh control circuit 300. The signal SameSecRequestBnk may indicate if any (and which) of the bank portions 320 are holding detected aggressor addresses which are all in the same section (or all in sections which are mutually adjacent to each other). For example, the signal SameSecRequestBnk may be a multi-bit signal with a single bit representing each bank. The bit for a given bank may be active if that bank portion 320 is holding aggressors which are in the same (or mutually adjacent) sections. In some embodiments, the dynamic steal rate control 312 may determine which refresh mode to use based on the SRCC value and whether or not any of the bits of the signal SameSecRequestBnk are at a high logical level.

The central portion 310 of the refresh control circuit 300 may also include a refresh timing control circuit 316. The refresh timing control circuit 316 may manage and provide various internal signals based on the refresh mode indicated by the refresh mode signals Mode0En to Mode3En. For example the refresh timing control circuit 316 may receive the refresh signal AREF and may generate a number of timing signals, which may in turn control the activation of one or more pump signals. For example, the refresh timing control circuit 316 may provide an auto-refresh signal Rfsh and a targeted refresh signal RHR. The auto-refresh signal Rfsh and targeted refresh signal RHR may be provided in common to the bank logic portions 320. When the signal Rfsh is active (e.g., at a high logical level), it may indicate that an auto-refresh operation should be performed. When the signal RHR is at an active level (e.g., at a high logical level) it may indicate that a targeted refresh operation should be performed. By managing the timing of when the signals Rfsh and RHR are active, the refresh timing circuit 316 can control how many refresh operations are performed responsive to each AREF signal, and which types of operations are performed. The bank portions 320 may then issue refresh addresses to their respective row decoders to perform the actual refresh operations.

The behavior of the refresh timing control circuit 316 may be based on which of the mode enable signals Mode0En to Mode3En is active (e.g., based on which refresh mode is active). For example, if the first refresh mode signal Mode0En is at an active level, then responsive to an activation of the refresh signal AREF, the refresh timing control circuit 316 may provide the signal Rfsh (e.g., to indicate an auto-refresh operation) and then provide the signal RHR twice (e.g., to indicate two targeted refresh operations). In some embodiments, the refresh timing control circuit 316 may also generate and provide the auto-refresh address along with the signal Rfsh, and may determine which and how many word lines are associated with the auto-refresh address based on the active refresh mode enable signals is active. In some embodiments, the auto-refresh addresses may be generated by the bank logic 320, and various additional signals (not shown) may be passed to the bank logic 320 to control which and how many word lines are associated with the auto-refresh address.

Figure 4:
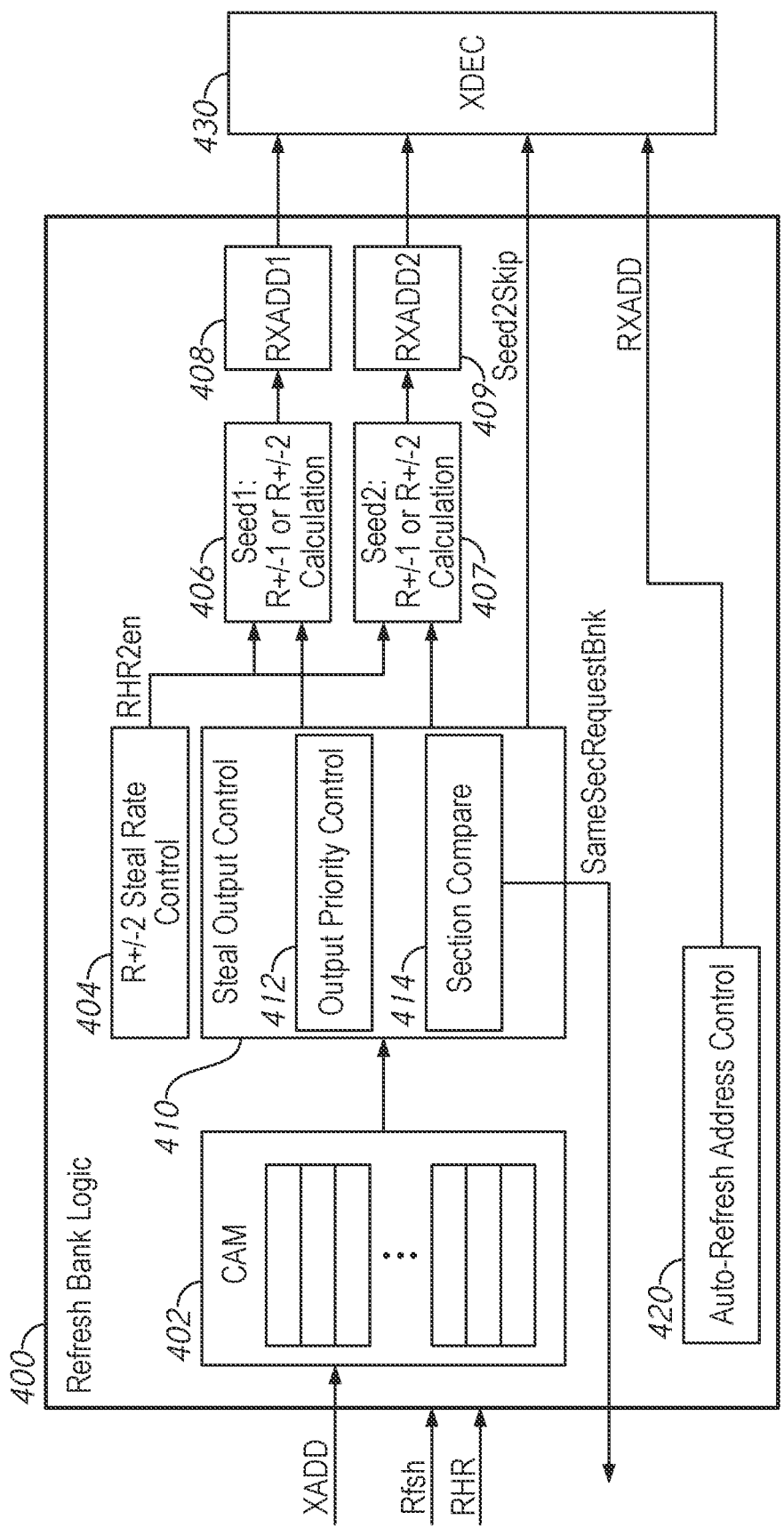
FIG. 4 is a block diagram of a bank portion of a refresh control circuit according to some embodiments of the present disclosure.

FIG. 4 is a block diagram of a bank portion of a refresh control circuit according to some embodiments of the present disclosure. The bank portion 400 may, in some embodiments, be included in the bank portion 320 of FIG. 3. The bank portion 400 may be associated with a single bank of the memory array, and may manage refresh operations by providing refresh addresses to a row decoder 430 (e.g., row decoder 108 of FIG. 1), which may then refresh the row(s) indicated by the refresh address(es) RXADD.

The bank portion 400 may include an auto-refresh address control circuit 420, which may be used to manage the auto-refresh addresses. Responsive to the auto-refresh signal Rfsh at an active level, the auto-refresh control circuit 420 may provide an auto-refresh address RXADD. For example, each auto-refresh address may indicate a certain number of word lines (e.g., 4 word lines) which may be refreshed at the same time. The auto-refresh address RXADD may indicate multiple word lines by truncating part (e.g., some number of bits) of the row address, such that the refresh address indicates multiple word lines. After providing a refresh address RXADD, the auto-refresh address control 420 may update the refresh address in order to move to a next set of wordlines in a sequence of word lines. For example, the auto-refresh address control circuit 420 may increment certain bits of the refresh address RXADD to generate the next refresh address. In some embodiments, the auto-refresh address control 420 may be located in a central portion (e.g., 310 of FIG. 3) of the refresh control circuit.

The bank portion 400 may include various circuits and structures for detecting aggressor addresses and calculating refresh addresses based on the victims of those aggressors. For example, the bank portion 400 may include an aggressor detector circuit. The aggressor detector circuit may store received row addresses XADD, and may identify aggressors based on the stored row addresses. For example, the aggressor detector may include a memory structure, such as a content-addressable memory (CAM) 402. The CAM 402 may have a number of registers, each of which may hold a received memory address, such as row address XADD. The row addresses may be provided along an address bus as part of an access operation to the row associated with that row address XADD. The received row address may be compared to the other addresses already stored in the CAM 402. If there is not a match, the received row address may be stored in the CAM 402 (replacing an old address if needed). If there is a match, then the address may be identified as an aggressor. In some embodiments, each register in the CAM 402 may be associated with a counter, which may increment when there is a match. The value of the counter may be used to identify aggressors.

In some embodiments, the CAM 402 may receive every address XADD along the row address bus. In some embodiments, the CAM 402 may receive a sampling signal, and may only receive the address XADD when the sampling signal is active. The sampling signal may be activated with random, semi-random, and/or pseudo-random timing in some embodiments.

The CAM 402 may be managed by a steal output control circuit 410. The steal output control circuit 410 may determine which of the addresses stored in the CAM 410 should be used to calculate victim addresses. The selected aggressors may generally be referred to as 'seed' addresses. The steal output control circuit 410 may include an output priority control circuit 412, which may select which of the addresses stored in the CAM 402 should be used as seeds. For example, the steal output control 412 may select the two oldest addresses in the CAM 402, or the two addresses which have been most recently matched to addresses along the address bus.

The steal output control circuit 410 may also have a section comparator circuit 414. The section comparator 414 may check the addresses in the CAM 402 to determine if the addresses in the CAM 402 are in the same (or adjacent) sections of the memory. If there are at least two addresses which are in different, non-adjacent sections (and there are multiple addresses in the CAM 402), then the section comparator 414 may provide the signal SameSecRequest for that bank at a high logical level. This may, in part, be used as a signal to enter the memory into a refresh mode where only a single address is refreshed as part of a targeted refresh operation. The output priority control 412 may also take the results from the section comparator 414 into account. For example, the output priority control 412 may prioritize finding two addresses which are in different non-adjacent sections if such a pair of addresses is available.

The steal output control circuit 410 may provide a first seed and a second seed address from the CAM 402 to first and second victim calculators 406 and 407 respectively. The victim address calculators 406 and 407 may determine the addresses of victims (or potential victims) of those seed addresses, which may then be refreshed. In some embodiments, the victims may be based on word lines which are physically close to word lines represented by the seed addresses. For example, the victims may be the word lines which are adjacent to the seed address (e.g., R+/−1). The calculated victim addresses may be stored in a first and second latch 408 and 409 respectively. The first latch 408 may hold a first refresh address RXADD1 provided by the first seed address victim calculator 406 and the second latch 409 may hold a second refresh address RXADD2 provided by the second seed address victim calculator 407.

The stored refresh addresses may be provided to a row decoder 430, which may simultaneously refresh the word lines associated with the first refresh address RXADD1 and the second refresh address RXADD2. Two address buses may couple the refresh control circuit to the row decoder 430. The row decoder 430 may have different portions for each section of a given bank. Each section portion of the row decoder 430 may receive the addresses RXADD1 and RXADD2 in common as inputs to a multiplexer. A control signal generated within the row decoder 430 may determine which of the two addresses RXADD1 and RXADD2 is used within that section for refreshing. In some embodiments, each section of the row decoder 430 may have two multiplexers, one for each received address, each of which selects between providing that received address for refreshing or providing no address. A decoder for the refresh addresses RXADD1 and RXADD2 may provide a command signal to each section of the row decoder 430. The two multiplexers in each section may respond to opposite levels of that section's command signal, such that only one may be active (e.g., providing the address) at a time.

The steal output control circuit 410 may provide a second seed skip signal Seed2Skip. When the signal Seed2Skip is at an active level the row decoder may refresh the first refresh address RXADD1 and not the second refresh address RXADD2. The steal output control circuit 410 may provide the signal Seed2Skip at an active level when there is only one detected aggressor which needs to have its victims refreshed (e.g., if there is only one address stored in the CAM 402).

In an example targeted refresh operation the memory may be in a refresh mode where two addresses are simultaneously refreshed as part of a targeted refresh operation (e.g., because the signal SameSecRequestBank is inactive for every bank). The steal output control circuit 410 may retrieve a first seed address Seed1 and a second seed address Seed2 from the CAM 402. The victim calculators 406 and 407 may calculate a first and a second victim address based on the respective first and second seeds. For example, the first refresh address RXADD1 may be the R+1 victim of Seed1, while the second refresh address RXADD2 may be the R+1 victim of Seed2. These two refresh addresses may be refreshed by the row decoder 430. The victim calculators 406 and 407 may then provide respective third and fourth victim addresses based on the respective first and the second seed addresses. For example, the first refresh address RXADD1 may now be the R−1 victim of Seed1 while the second refresh address RXADD2 may now be the R−1 victim of Seed2. The row decoder 430 may refresh these two refresh addresses at the same time. The steal output control circuit 410 may then retrieve new seed addresses from the CAM 402 for further refresh operations.

In an example targeted refresh operation the memory may be in a refresh mode where only one refresh address is refreshed per pump (e.g., because at least one of the signals SameSecRequestBank is active). The steal control circuit 410 may retrieve a first seed address Seed1 from the CAM 402. The first seed address Seed1 may be provided to the first victim address calculator 406, which may calculate a first refresh address RXADD1 (e.g., which may be the R+1 of Seed1), and provide it to the first latch 408. The row decoder 430 may then refresh the first refresh address RXADD1. The first victim address calculator 406 may then calculate a second refresh address based on the first seed address Seed1. For example, the refresh address RXADD1 may be updated to the R−1 address of Seed1. The row decoder 430 may then refresh this address. The steal output control 410 may then retrieve one or more new addresses from the CAM 402 to use as seed addresses for subsequent targeted refresh operations.

In some embodiments, word lines further from the seed word line may also be refreshed. For example, the memory may refresh word lines which are adjacent to the R+/−1 word lines (e.g., the R+/−2 word lines). The R+/−2 word lines may undergo a slower rate of decay than the R+/−1 word lines and may thus need to be refreshed less frequently. In order to mitigate this, the memory may periodically refresh the R+/−2 word lines instead of the R+/−1 word lines. For example, the bank portion 400 may include a R+/−2 steal rate control circuit 404, which may provide a signal RHR2*en*. When the signal RHR2*en* is active, instead of calculating the R+1 or R−1 victim addresses, the first and the second victim address calculators 406 and 407 may calculate the R+2 and R−2 victim addresses instead.

The R+/−2 steal rate control circuit 404 may count a number of times that targeted refresh operations are performed (e.g., a number of activations of the signal RHR) and may provide the signal RHR2*en* at an active level based on that count. For example, the signal RHR2*en* may be active for one in every eight targeted refresh operations.

Figure 5:
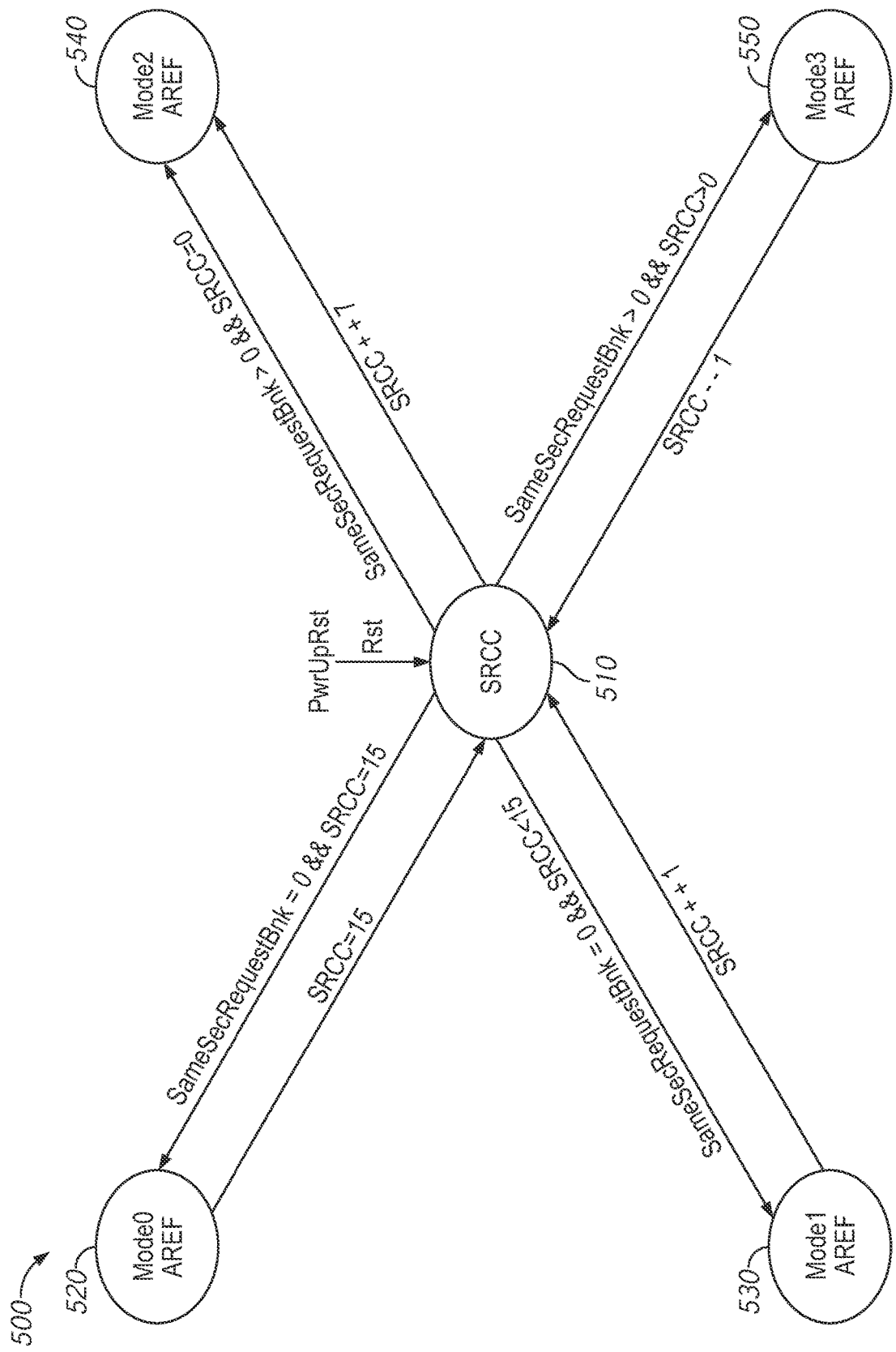
FIG. 5 is a state diagram of refresh modes of a memory according to some embodiments of the present disclosure.

FIG. 5 is a state diagram of refresh modes of a memory according to some embodiments of the present disclosure. The state diagram 500 may, in some embodiments, represent different refresh modes that may be used by one or more of the memories (or memory components) of FIGS. 1-4. For example, the state diagram 500 may represent the states of a state machine such as the dynamic steal rate control circuit 312 of FIG. 3.

Mode 510 represents checking the value of a steal rate control counter (SRCC) (e.g., SRCC 314 of FIG. 3) as well as the value of a same section address signal (e.g., SameSecRequestBnk of FIGS. 3-4). Based on these values, the state machine may determine which refresh mode 520-550 to perform when a refresh signal (e.g., AREF) is received. After performing the refreshes associated with the determined refresh mode, the state machine may return to the initial mode 510 to determine which refresh mode to use for the next activation of the refresh signal.

The initial mode 510 may also represent an initial state of the memory system. For example, after a power up or reset operation of the memory (e.g., as indicated by a PwrUpRst signal), the memory may enter initial mode 510 and begin monitoring the SRCC value and the SameSecRequestBnk signal. In some embodiments, the value of the SRCC may be reset to an initial value (e.g., 0) responsive to the PwrUpRst signal.

If the signal SameSecRequestBnk is low for all banks (e.g., all bank refresh portions include at least a pair of refresh addresses which are in different non-adjacent sections) and the SRCC is at a maximum value (or above a threshold value), the memory may enter a first refresh mode 520. The first refresh mode 520 may involve performing an auto-refresh operation followed by at least one targeted refresh operation where multiple targeted refresh addresses are refreshed together. After performing refresh operations, the value of the SRCC may be maintained at its current (e.g., maximum) value, and the memory may return to the initial state 510.

If the signal SameSecRequestBnk is low for all banks (e.g., all bank refresh portions include at least a pair of refresh addresses which are in different non-adjacent sections) and the SRCC is below a maximum value (or below a threshold value), the memory may enter a second refresh mode 530. The second refresh mode 530 may be similar to the first refresh mode 520, except in the second refresh mode 530, more word lines are refreshed as part of the auto-refresh operation. After performing refresh operations responsive to the refresh signal in the second mode, the SRCC value may be incremented.

If the signal SameSecRequestBnk has at least one bit at a high logical level (e.g., at least one bank does not include a pair of identified aggressors in different non-adjacent sections) and the SRCC is at a minimum value (e.g., 0), then the memory may enter a third refresh mode 540. Responsive to the refresh signal AREF in the third refresh mode 540, the memory may perform auto-refresh operations but not targeted refresh operations. After performing the refresh operations, the SRCC value may be increased by a value. For example, in the embodiment of FIG. 5, the SRCC value may be increased by 7. Different values (and different sizes of the maximum value of the SRCC) may be used to adjust average numbers of seed addresses which are refreshed per activation of the refresh signal AREF.

If the signal SameSecRequestBnk has at least one bit at a high logical level (e.g., at least one bank does not include a pair of identified aggressors in different non-adjacent sections) and the SRCC is above a minimum value (e.g., SRCC>0), then the memory may enter a fourth refresh mode 550. Responsive to the refresh signal AREF in the fourth refresh mode 550, the memory may perform targeted refresh operations but not auto-refresh operations. In the fourth refresh mode 550 (unlike the first mode 520 and second mode 530) each targeted refresh operation may include refreshing a single refresh address.

Figure 6:
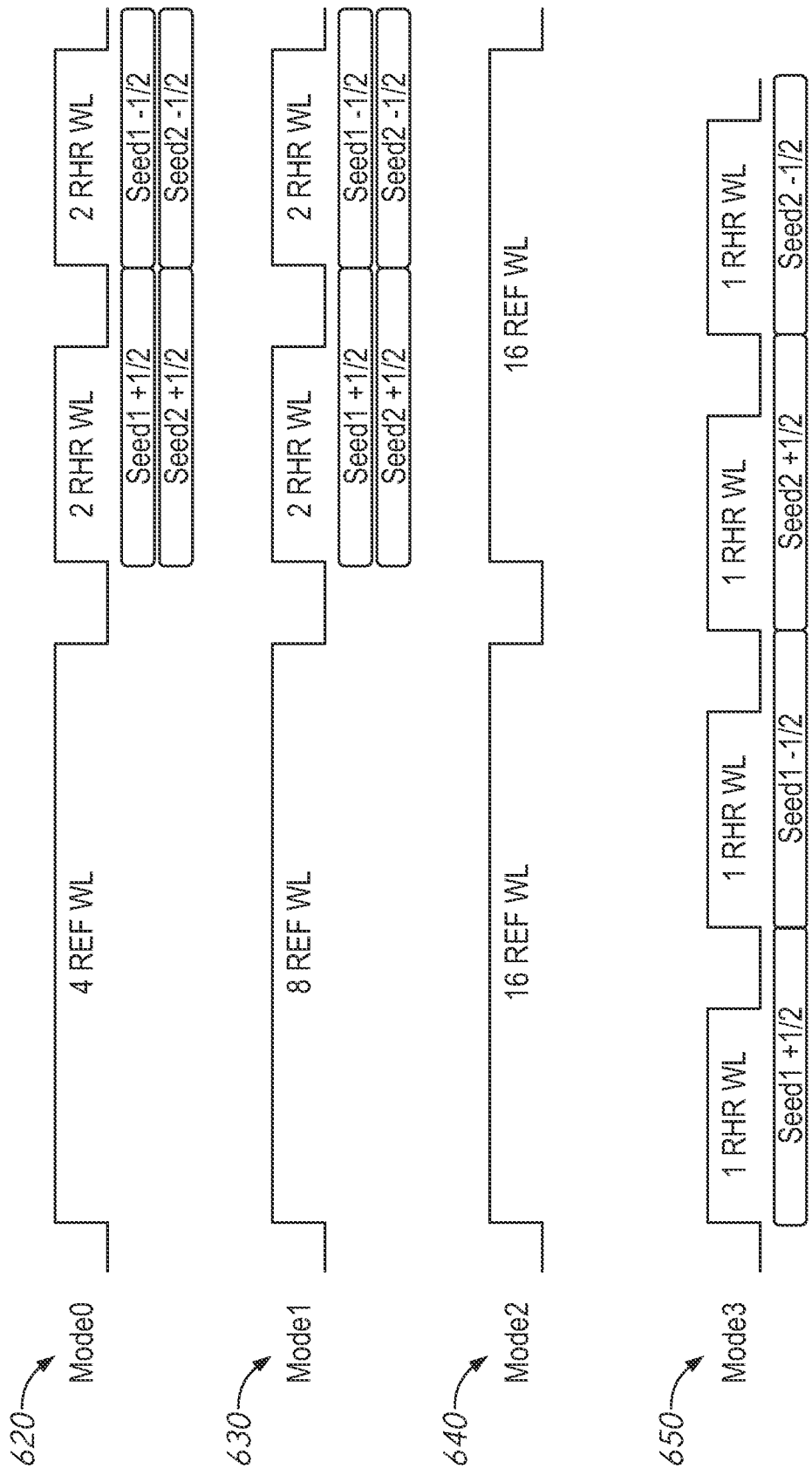
FIG. 6 is a timing diagram of different refresh modes according to some embodiments of the present disclosure.

FIG. 6 is a timing diagram of different refresh modes according to some embodiments of the present disclosure. The timing diagrams 620-650 shows different groups of refresh operations which may each be performed responsive to an activation of a refresh signal (e.g., AREF) when the memory is in different refresh modes. In some embodiments, the timing diagrams 620-650 may represent the respective refresh modes 520-550 of FIG. 5. It should be noted that the timing diagrams 620-650 do not necessarily share the same time access and are not necessarily to scale with each other. For example, the refresh operations represented by the timing diagram 640 may take more time to complete than the refresh operations represented by the timing diagram 650.

Timing diagram 620 shows refresh operations in a first refresh mode (e.g., mode 520 of FIG. 5). Responsive to an activation of the refresh signal, there may be 3 refresh pumps. A first pump is used for an auto-refresh operation, and 4 word lines may be refreshed. A second pump is used for targeted refresh operations. During the first pump the R+1 victims may be refreshed for a first seed address Seed1 and a second seed address Seed2. The third pump may be used to refresh the victims of the addresses Seed1 and Seed2. In some embodiments, when an R+/−2 refresh is called for, the second pump may be used to refresh the R+2 victims of the addresses Seed1 and Seed2 and the third pump may be used to refresh the R−2 victims of the addresses Seed1 and Seed2.

Timing diagram 630 shows refresh operations in a second refresh mode (e.g., mode 530 of FIG. 5). The timing diagram 630 may be generally similar to the timing diagram 620, except that in the timing diagram 630, more word lines are refreshed during the first auto-refresh pump. In particular, during the first pump of the timing diagram 630, eight word lines are refreshed as part of an auto-refresh operation.

Timing diagram 640 shows refresh operations in a third refresh mode (e.g., mode 540 of FIG. 5). The timing diagram 640 includes two refresh pumps. During each refresh pump, 16 word lines are refreshed as part of an auto-refresh operation.

Timing diagram 650 shows refresh operations as part of a fourth refresh mode (e.g., mode 550 of FIG. 5). The timing diagram 650 includes four refresh pumps. Each pump is used for a targeted refresh operation which refreshes a single refresh word line. For example, the first pump may be used to refresh R+1 victim of a first seed address Seed1. The second pump may be used to refresh R−1 victim of the first seed address Seed1. The third pump may be used to refresh the R+1 victim of a second seed address Seed2. The fourth pump may be used to refresh the R−1 victim of a second seed address Seed2. In some embodiments, if an R+/−2 refresh is called for than R+2 or R−2 victims may be refreshed instead.

Figure 7:
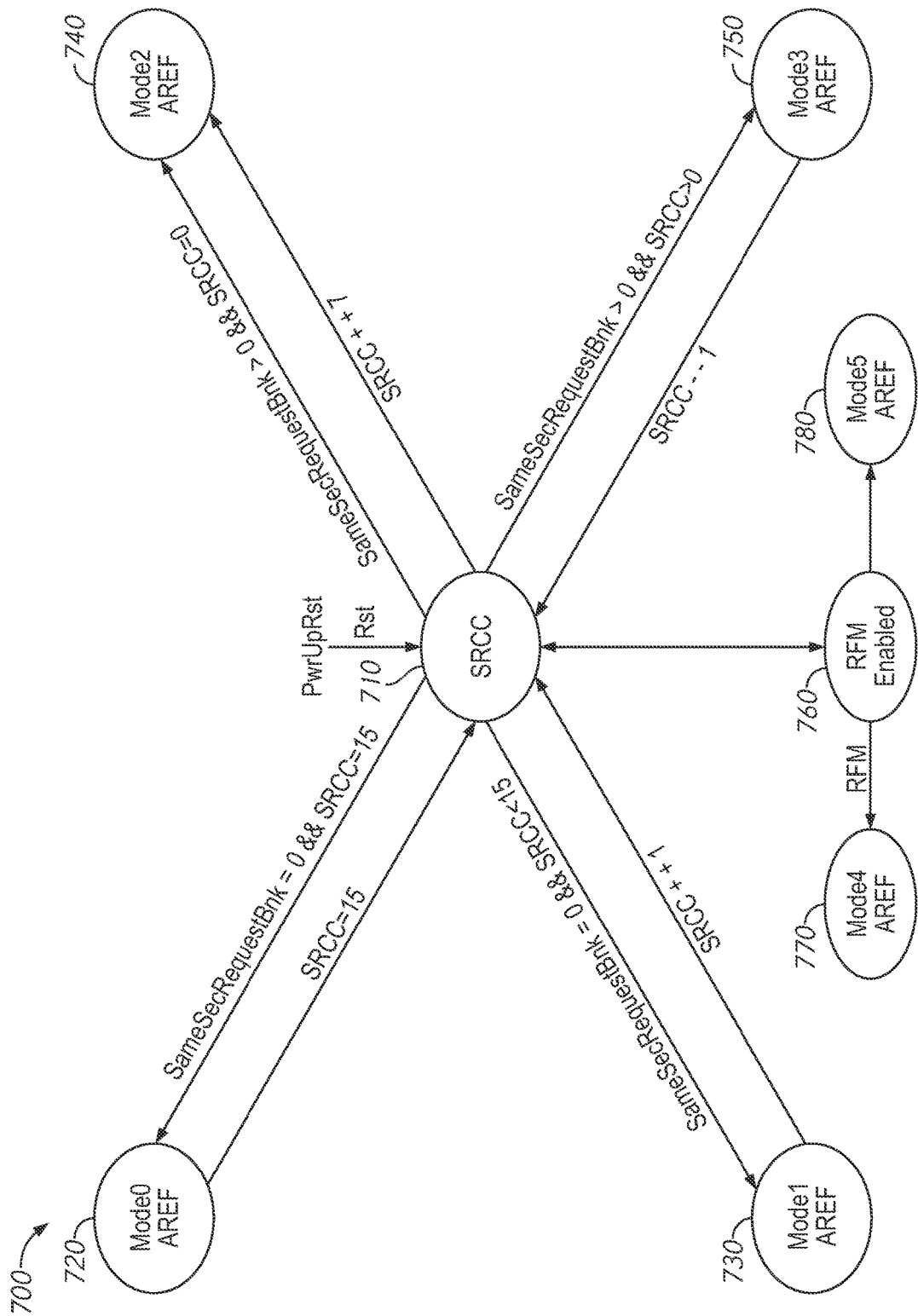
FIG. 7 is a state diagram of a memory with a refresh management mode according to some embodiments of the present disclosure.

FIG. 7 is a state diagram of a memory with a refresh management mode according to some embodiments of the present disclosure. The state diagram 700 may be generally similar to the state diagram 500 of FIG. 5, except that in the state diagram 700, there are two additional refresh modes to accommodate a refresh management (RFM) mode of the memory. For the sake of brevity modes and operations similar to those previously described with respect to FIG. 5 will not repeated again with respect to FIG. 7.

Some memories may include an RFM mode, in which when the RFM mode is enabled, the controller may monitor access operations to a memory, and may control the ratio of auto refresh operations and targeted refresh operations. When an RFM mode is enabled, the memory may move from the initial state 710 to an RFM enabled mode 760. While the RFM mode remains enabled, the memory may perform refreshes as part of a fifth mode 770 when an REM signal is active and an activation of the refresh signal AREF is received from the controller, and may perform refreshes as part of a sixth mode 780 when the refresh signal AREF is received by the signal RFM is not active. In some embodiments, the controller may count access operations to the memory and may activate the signal RFM when the count crosses a threshold.

The fifth mode 770 may involve performing targeted refresh operations, each of which refreshes a single victim word line. The sixth mode 780 may include auto-refresh and targeted refresh operations.

Figure 8:
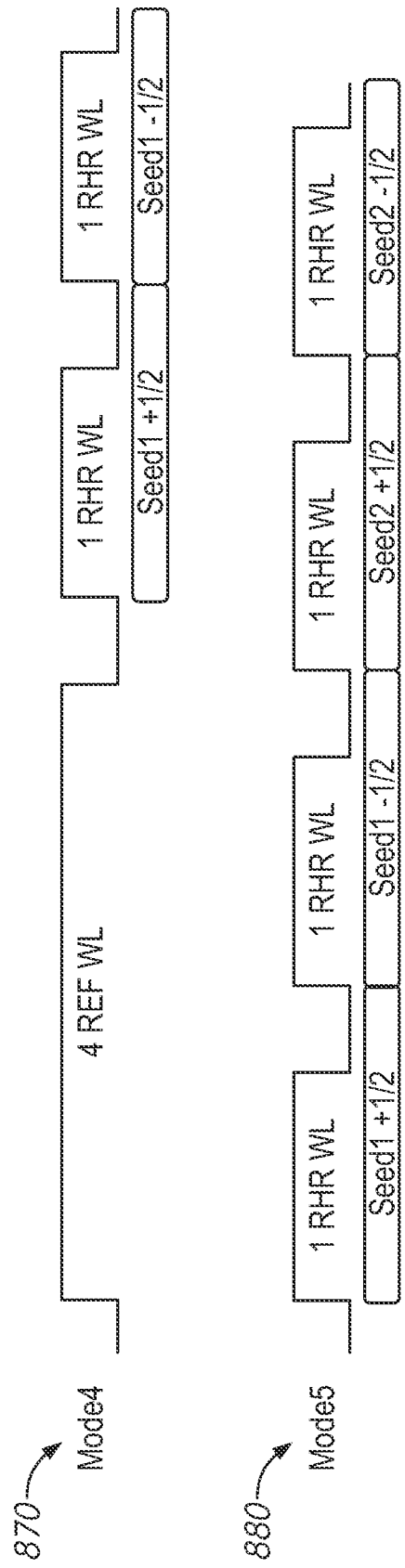
FIG. 8 is a timing diagram of different refresh modes according to some embodiments of the present disclosure.

FIG. 8 is a timing diagram of different refresh modes according to some embodiments of the present disclosure. The timing diagrams 870 and 880 may represent the fifth refresh mode 770 and sixth refresh mode 780 of FIG. 7. The timing diagrams 870 and 880 may generally be similar to the timing diagrams of FIG. 6.

The timing diagram 870 shows a fifth refresh mode which includes 3 refresh pumps. The first pump is used to refresh four word lines as part of an auto-refresh operation. The second pump is used to refresh the R+1 (or R+2) victim of a first seed address Seed1. The third pump is used to refresh the R−1 (or R−2) victim of the first seed address Seed1.

The timing diagram 880 shows a sixth refresh mode which includes 4 refresh pumps. The first two pumps are used to refresh the R+1 and R−1 (or R+2 and R−2) victims of a first seed address Seed1. The third and fourth pumps are used to refresh the R+1 and R−1 (or R+2 and R−2) victims of a second seed address Seed2.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Figure 9:
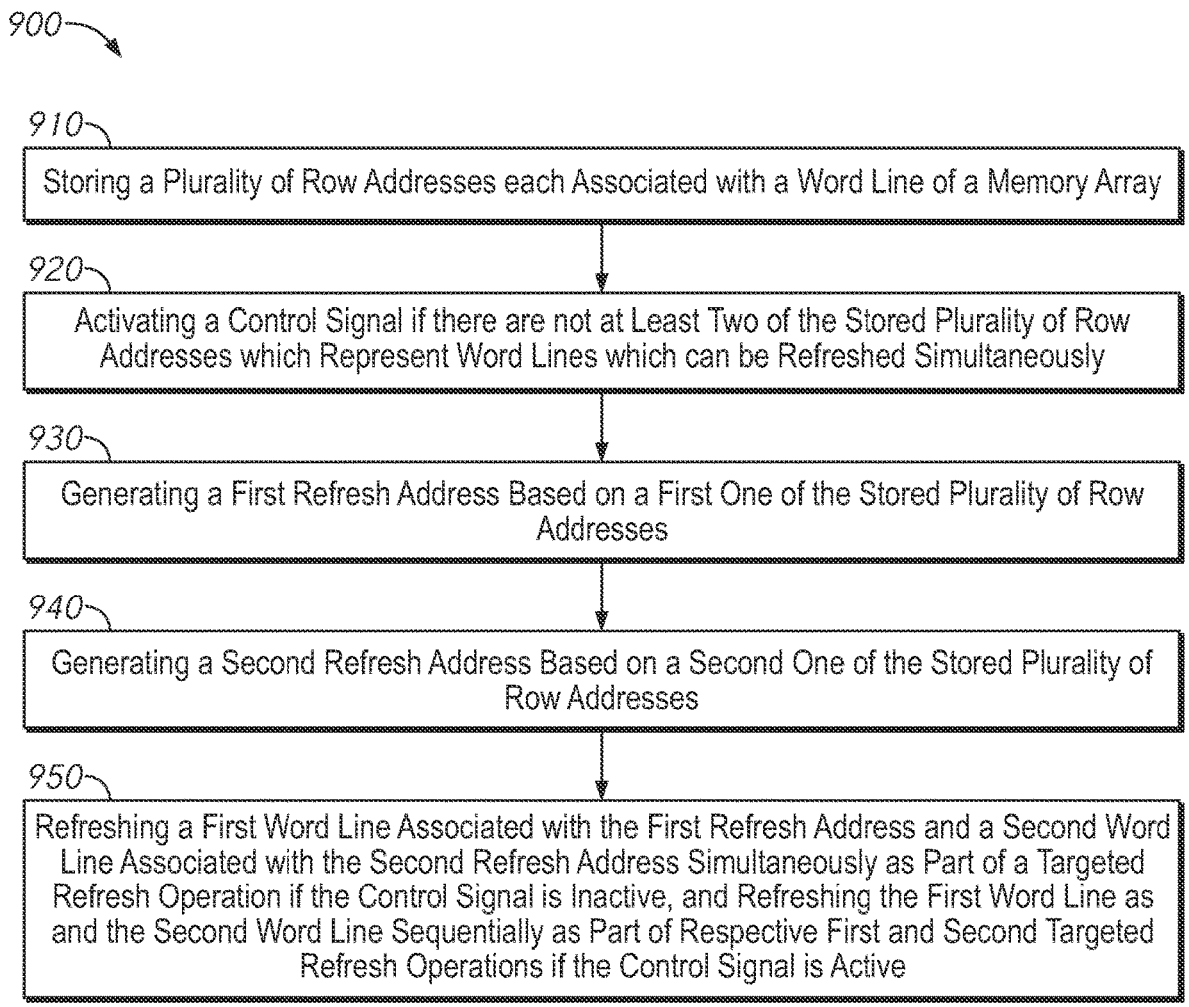
FIG. 9 is a flow chart of a method according to some embodiments of the present disclosure.

FIG. 9 is a flow chart of a method according to some embodiments of the present disclosure. The method 900 may, in some embodiments, be performed by one or more of the apparatuses or systems of FIGS. 1-4 and may operate it one or more of the manners described in FIGS. 5-8.

The method 900 may generally begin with box 910, which describes storing a plurality of row addresses each associated with a word line of a memory array. The row addresses may be received along a row address bus as part of access operations on the memory. The row addresses may be stored in an aggressor detector (e.g., CAM 402 of FIG. 4). In some embodiments, only a portion of the addresses along the bus may be sampled and stored. In some embodiments, all addresses along the bus may be stored.

Box 910 may generally be followed by box 920, which describes activating a control signal if there are not at least two of the stored plurality of row addresses which represent word lines which can be refreshed simultaneously. For example, a section comparator may check the stored addresses to determine if there are at least two of the stored addresses which are in different non-adjacent sections. In some embodiments, the section comparator may check the addresses in the aggressor detector responsive to a refresh signal (e.g., AREF).

Box 920 may be generally followed by box 930, which describes generating a first refresh address based on a first one of the stored plurality of row addresses. The first refresh address may be an address associated with a word line which is adjacent to the word line represented by the first one of the stored plurality of row addresses. In some embodiments, the first refresh address may be generated responsive to the refresh signal AREF. In some embodiments, the first refresh address may be generated responsive to a targeted refresh signal (e.g., RHR).

Box 930 may generally be followed by box 940, which describes generating a second refresh address based on a second one of the stored plurality of row addresses. The process of generating the second refresh address may generally be similar to generating the first refresh address as described in box 930. In some embodiments, the operations described in boxes 930 and 940 may be performed simultaneously.

Box 940 may generally be followed by box 950, which describes refreshing a first word line associated with the first refresh address and a second word line associated with the second refresh address simultaneously as part of a targeted refresh operation if the control signal is inactive, and refreshing the first word line as and the second word line sequentially as part of respective first and second targeted refresh operations if the control signal is active.

Whether the two refresh addresses are refreshed together or not may be based by which refresh mode of the memory is active. For example the method 900 may include activating a refresh mode of the memory based on the control signal.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a central portion of a refresh control circuit configured to provide pump signals responsive to receiving a refresh signal, wherein a number and type of the pump signals are based on a current refresh mode, wherein the central portion is configured to adjust a count value based on the pump signals; and
a plurality of bank specific portions of the refresh control circuit configured to receive the pump signals in common, wherein each of the plurality of bank specific portions are configured to perform refresh operations on an associated one of a plurality of memory banks, wherein a number and type of the refresh operations is based on the number and the type of the pump signal, wherein each of the plurality of bank specific portions is configured to store one or more address and provides a respective one of a plurality of control signals based on the stored one or more addresses,
wherein the central portion is configured to select the current refresh mode based on the count value and the plurality of control signals, and
wherein each of the plurality of bank specific portions is configured to provide the respective one of the plurality of control signals at an active level if there are not two of the stored one or more addresses which can be simultaneously refreshed in the bank specific portion.

2. The apparatus of claim 1, wherein each of the associated one of the plurality of memory banks includes a plurality of sections, and
wherein each of the plurality of bank specific portions includes a section comparator configured to provide the respective one of the plurality of control signals at the active level if there are not at least two of the stored one or more addresses which are in different non-adjacent ones of the plurality of sections.

3. The apparatus of claim 1, wherein the central portion is further configured to select a current refresh mode based on a refresh management signal.

4. An apparatus comprising:
a central portion of a refresh control circuit configured to provide pump signals responsive to receiving a refresh signal, wherein a number and type of the pump signals are based on a current refresh mode, wherein the central portion is configured to adjust a count value based on the pump signals; and
a plurality of bank specific portions of the refresh control circuit configured to receive the pump signals in common, wherein each of the plurality of bank specific portions are configured to perform refresh operations on an associated one of a plurality of memory banks, wherein a number and type of the refresh operations is based on the number and the type of the pump signal, wherein each of the plurality of bank specific portions is configured to store one or more address and provides a respective one of a plurality of control signals based on the stored one or more addresses,
wherein the central portion is configured to select the current refresh mode based on the count value and the plurality of control signals, and wherein the central portion is configured to select a first refresh mode as the current refresh mode if at least one of the plurality of control signals is at an active level, wherein as part of refresh operations while the first refresh mode is active, a first refresh address based on one of the stored one or more addresses and a second refresh address based on a different one of the stored one or more addresses are refreshed sequentially.

5. The apparatus of claim 4, wherein the central portion is configured to select a second refresh mode as the current refresh mode if none of the plurality of control signals is at the active level, wherein as part of refresh operations while the second refresh mode is active, the first refresh address based on the one of the stored one or more addresses and the second refresh address based on the different one of the stored one or more addresses are refreshed at the same time.

6. An apparatus comprising:
a central portion of a refresh control circuit configured to provide pump signals responsive to receiving a refresh signal, wherein a number and type of the pump signals are based on a current refresh mode, wherein the central portion is configured to adjust a count value based on the pump signals; and
a plurality of bank specific portions of the refresh control circuit configured to receive the pump signals in common, wherein each of the plurality of bank specific portions are configured to perform refresh operations on an associated one of a plurality of memory banks, wherein a number and type of the refresh operations is based on the number and the type of the pump signal, wherein each of the plurality of bank specific portions is configured to store one or more address and provides a respective one of a plurality of control signals based on the stored one or more addresses,
wherein the central portion is configured to select the current refresh mode based on the count value and the plurality of control signals, and
wherein the central portion is further configured to select a refresh mode as the current refresh mode based, in part, on the count value at a minimum value, and select a different refresh mode as the current refresh mode if the count value is at a maximum value.

7. An apparatus comprising:
a central portion of a refresh control circuit configured to determine a refresh mode based, in part, on a plurality of control signals, wherein the central portion is configured to determine a number and type of refresh operations based on the refresh mode; and
a plurality of bank specific portions of the refresh control circuit each configured to perform refresh operations based on the number and the type determined by the central portion, store at least one address and provide a respective one of the plurality of control signals based on the stored at least one address, and wherein each of the bank specific portions is configured to provide the respective one of the plurality of control signals based in part, on a comparison between the stored at least one addresses.

8. The apparatus of claim 7, wherein the central portion is configured to adjust a count value passed on the number and type of refresh operations, and wherein the determination of the refresh mode is based, in part, on the count value.

9. The apparatus of claim 7, wherein each of the bank specific portions is configured to provide the respective one of the plurality of control signals at an active level if there are not two of the stored at least one addresses which can be simultaneously refreshed.

10. The apparatus of claim 7, wherein the central portion provides at least one pump signal responsive to a refresh signal, wherein each of the at least one pump signals indicates a first type or a second type of refresh operation.

11. An apparatus comprising:
a central portion of a refresh control circuit configured to determine a refresh mode based, in part, on a plurality of control signals, wherein the central portion is configured to determine a number and type of refresh operations based on the refresh mode; and
a plurality of bank specific portions of the refresh control circuit each configured to perform refresh operations based on the number and the type determined by the central portion, store at least one address and provide a respective one of the plurality of control signals based on the stored at least one address,
wherein the central portion provides at least one pump signal responsive to a refresh signal, wherein each of the at least one pump signals indicates a first type or a second type of refresh operation, and
wherein responsive to the second type of refresh operation each of the second type causes each bank specific portion to provide a refresh address based on the stored at least one address.

12. An apparatus comprising:
a central portion of a refresh control circuit configured to determine a refresh mode based, in part, on a plurality of control signals, wherein the central portion is configured to determine a number and type of refresh operations based on the refresh mode; and
a plurality of bank specific portions of the refresh control circuit each configured to perform refresh operations based on the number and the type determined by the central portion, store at least one address and provide a respective one of the plurality of control signals based on the stored at least one address, wherein the central portion is configured to select the mode based in part, on a comparison of the count value to a minimum value and a maximum value.

13. A method comprising:
storing at least one row address in each of a plurality of bank specific portions of a refresh control circuit;
providing a respective one of a plurality of control signals from each of the plurality of bank specific portions, wherein the plurality of control signals are based on the stored at least one row address;
generating a plurality of pump signals responsive to receiving a refresh signal at a central portion of a refresh control circuit, wherein a number and type of the plurality of pump signals are based on a current refresh mode;
changing a count value based on the plurality of pump signals;
determining the current refresh mode based on the count value and the plurality of control signals; and
determining a state of the respective one of the plurality of control signals based on if there are not two of the stored one or more addresses which can be simultaneously refreshed stored in the associated one of the plurality of bank specific portions.

14. The method of claim 13, further comprising performing refresh operations with each of the plurality of bank specific portions of the refresh control circuit on an associated one of a plurality of memory banks responsive to the plurality of pump signals.

15. The method of claim 13, further comprising determining the state of the respective one of the plurality of control signals based on a location of the two of the stored one or more addresses within a memory bank.

16. The method of claim 13, further comprising comparing the count value to a maximum value and a minimum value, and determining the current refresh mode based, in part, on the comparison.

17. A method comprising:
   storing at least one row address in each of a plurality of bank specific portions of a refresh control circuit;
   providing a respective one of a plurality of control signals from each of the plurality of bank specific portions, wherein the plurality of control signals are based on the stored at least one row address;
   generating a plurality of pump signals responsive to receiving a refresh signal at a central portion of a refresh control circuit, wherein a number and type of the plurality of pump signals are based on a current refresh mode;
   changing a count value based on the plurality of pump signals;
   determining the current refresh mode based on the count value and the plurality of control signals; and
   entering a first refresh mode based on at least one of the plurality of control signals being active, wherein as part of the first refresh mode, a first refresh address and a second refresh address are refreshed sequentially; and
   entering a second refresh mode based on none of the plurality of control signals being active, wherein as part of the second refresh mode, wherein as part of the first refresh mode the first refresh address and the second refresh address are refreshed at the same time.

* * * * *